(12) United States Patent  (10) Patent No.: US 9,095,077 B2
Bhardwaj  (45) Date of Patent: Jul. 28, 2015

(54) GRAPHENE HEAT DISSIPATORS IN PORTABLE ELECTRONIC DEVICES

(75) Inventor: Ramesh C. Bhardwaj, Fremont, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 13/307,897

(22) Filed: Nov. 30, 2011

(65) Prior Publication Data

US 2013/0136966 A1    May 30, 2013

(51) Int. Cl.
*H05K 7/20*    (2006.01)

(52) U.S. Cl.
CPC ....... *H05K 7/20481* (2013.01); *Y10T 29/49002* (2015.01)

(58) Field of Classification Search
CPC ........ Y02E 60/12; H01M 2/10; H01M 4/366; H01M 2/0404; H01M 2004/021; H01M 2/22; H01M 2220/20; H01M 10/02
USPC ........ 429/94, 120, 231.95; 320/137; 427/96.1
See application file for complete search history.

(56) References Cited

U.S. PATENT DOCUMENTS

| | | | |
|---|---|---|---|
| 2008/0203972 A1* | 8/2008 | Sather et al. | 320/137 |
| 2010/0092859 A1* | 4/2010 | Kim et al. | 429/178 |
| 2010/0173193 A1* | 7/2010 | Kim | 429/178 |
| 2012/0282419 A1* | 11/2012 | Ahn et al. | 428/34.8 |

* cited by examiner

*Primary Examiner* — Cynthia H Kelly
*Assistant Examiner* — Monique Wills
(74) *Attorney, Agent, or Firm* — Park, Vaughan, Fleming & Dowler LLP; Chia-Hsin Suen

(57) ABSTRACT

The disclosed embodiments relate to techniques for facilitating thermal transfer in a portable electronic device. The portable electronic device includes a battery pack, which further includes a battery cell. The battery pack may supply power to a set of components in the portable electronic device. The portable electronic device also includes a heat dissipator composed of graphene. The heat dissipator may be in thermal contact with one or more of the components. The heat dissipator may also be disposed over a surface of the battery pack.

18 Claims, 4 Drawing Sheets

GRAPHENE HEAT DISSIPATORS IN PORTABLE ELECTRONIC DEVICES

BACKGROUND

1. Field

The present embodiments relate to heat dissipation in portable electronic devices. More specifically, the present embodiments relate to the use of graphene in heat dissipators for portable electronic devices.

2. Related Art

A modern portable electronic device typically contains a set of tightly packed components. For example, a mobile phone may include a microphone, display, speakers, camera, buttons, battery, processor, memory, internal storage, and/or ports in a package that is less than 0.5 inches thick, 4-5 inches long, and 2-3 inches wide. Moreover, most components in the portable electronic device generate heat, which must be dissipated to enable safe use of the portable electronic device and improve long-term reliability. For example, heat generated by components in a mobile phone may be spread across the enclosure of the mobile phone to prevent damage to the components and increase user comfort and safety while operating the mobile phone.

However, heat-dissipation mechanisms for portable electronic devices generally involve the use of additional parts and/or materials. For example, heat sinks, cooling fans, heat pipes, thermal spreaders, and/or vents may be used to dissipate heat from components in a laptop computer. Such heat-dissipating parts and/or materials may take up space within the portable electronic devices and may add to the cost of the portable electronic devices.

Hence, space-efficient designs for portable electronic devices may be facilitated by mechanisms that reduce the dependence of the portable electronic devices on conventional heat-dissipating parts and/or materials.

SUMMARY

The disclosed embodiments relate to techniques for facilitating thermal transfer in a portable electronic device. The portable electronic device includes a battery pack, which further includes a battery cell. The battery pack may supply power to a set of components in the portable electronic device. The portable electronic device also includes a heat dissipator composed of graphene. The heat dissipator may be in thermal contact with one or more of the components. The heat dissipator may also be disposed over a surface of the battery pack.

In some embodiments, the set of components includes at least one of a processor, a power supply unit (PSU), a backlight, a charging circuit, a printed circuit board (PCB), a hard disk drive (HDD), and a radio transceiver.

In some embodiments, the battery cell corresponds to a lithium-ion and/or lithium-polymer battery cell that contains a set of layers, including a cathode with an active coating, a separator, and an anode with an active coating. The battery cell also includes a pouch enclosing the layers, wherein the pouch is flexible. The layers may be wound to create a jelly roll prior to sealing the layers in the flexible pouch.

In some embodiments, the pouch includes a layer of aluminum and a layer of polypropylene. The heat dissipator may be disposed over the layer of propylene.

In some embodiments, the battery cell corresponds to a solid-state battery cell that includes a cathode current collector, a cathode active material, a solid electrolyte, an anode active material, and an anode current collector. The solid electrolyte may include lithium phosphorus oxynitride (LiPON).

In some embodiments, the heat dissipator is configured to transfer heat from the components to the solid-state battery cell. The transferred heat may increase the temperature of the solid-state battery cell and improve the runtime of the solid-state battery cell.

In some embodiments, the thermal contact between the heat dissipator and the one or more of the components is provided by further disposing the heat dissipator over a surface of one or more of the components.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
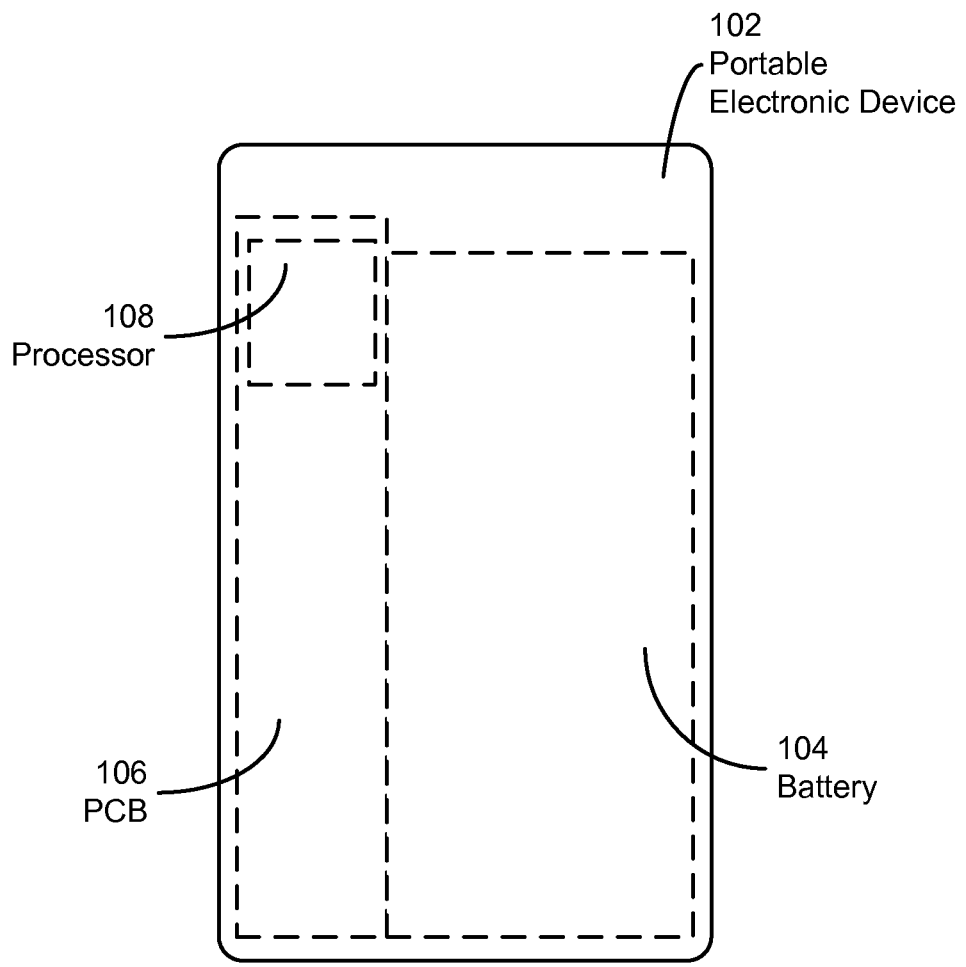
FIG. 1 shows the arrangement of components within a portable electronic device in accordance with the disclosed embodiments.

FIG. 1 shows the arrangement of components within a portable electronic device 102 in accordance with an embodiment. Portable electronic device 102 may correspond to a laptop computer, tablet computer, personal digital assistant (PDA), portable media player, mobile phone, digital camera, and/or other type of battery-powered electronic device. As shown in FIG. 1, a battery 104 and a printed circuit board (PCB) 106 are arranged within portable electronic device 102. Battery 104 may be placed side-by-side with PCB 106 within the enclosure for portable electronic device 102. In addition, the relatively large size of battery 104 may cause battery 104 to occupy a significant portion of space within portable electronic device 102.

Battery 104 may supply power to PCB 106 and/or other components of portable electronic device 102. In particular, battery 104 may correspond to a lithium-polymer battery that includes one or more battery cells. Each battery cell may contain a number of layers, including a cathode with an active coating, a separator, and an anode with an active coating. The cathode, anode, and separator layers may be wound on a mandrel to form a spirally wound structure (e.g., jelly roll). The layers may also be enclosed in a flexible pouch made of a layer of aluminum and a layer of polypropylene. Conductive tabs that extend through seals in the pouch may then be used to electrically couple the battery cell with one or more other battery cells to form a battery pack. For example, the battery pack may be formed by coupling the battery cells in a series, parallel, or series-and-parallel configuration.

Alternatively, battery 104 may correspond to a solid-state battery that is formed by layering a cathode current collector, a cathode active material, a solid electrolyte, an anode active material, and an anode current collector on top of a non-conducting substrate. For example, a vacuum deposition technique may be used to deposit the cathode current collector as a layer of platinum and/or gold onto the substrate and the anode current collector as a layer of copper onto the substrate. Next, a sputtering technique may be used to deposit a lithium compound corresponding to the cathode active material onto the cathode current collector, along with a thin film of lithium phosphorus oxynitride (LiPON) corresponding to the solid electrolyte over the cathode current collector, cathode active material, substrate, and/or anode current collector. A layer of lithium may then be thermally evaporated onto the LiPON to form the anode active material. Finally, the deposited layers may be sealed in a protective package such as a polymer frame and/or flexible pouch.

PCB 106 may contain electronic components that are used to operate portable electronic device 102. For example, PCB 106 may be used to electrically connect a processor 108, memory, hard disk drive (HDD), input/output (I/O) components, and/or ports on a portable media player. The electronic components may be powered by battery 104 and/or by an external power source (e.g., power adapter) during operation.

Those skilled in the art will appreciate that the operation of portable electronic device 102 may generate heat with increased use of components (e.g., on PCB 106), resulting in an increase in the temperature(s) of the components. For example, processor-intensive operations on a laptop computer may cause the central processing unit (CPU) of the computer to heat up. Such localized heat buildup may cause discomfort and/or injury to a user, and may further cause the components to lose reliability, behave unpredictably, and/or fail prematurely.

As a result, portable electronic device 102 may include mechanisms for dissipating heat from the components. For example, a layer of graphite thermal spreader material may be positioned over the surface of battery 104 and placed in thermal contact with PCB 106 to allow heat generated by components on PCB 106 to spread to battery 104, the enclosure of portable electronic device 102, and/or other areas of portable electronic device 102. In other words, the thermal spreader material may facilitate thermal transfer within portable electronic device 102.

However, heat-dissipation materials may take up space within portable electronic device 102 and may increase the material and assembly costs for portable electronic device 102. For example, a thermal spreader composed of a 30-micron layer of graphite film may occupy space that may otherwise be used by battery 104, PCB 106, and/or other components in portable electronic device 102.

In one or more embodiments, thermal transfer in portable electronic device 102 is facilitated by replacing conventional thermal spreaders in portable electronic device 102 with a heat dissipator composed of graphene. The heat dissipator may be disposed over a surface of battery 104 and placed in thermal contact with PCB 106 and/or other components. As discussed in further detail below with respect to FIG. 2, the high thermal conductivity and/or tensile strength of graphene may allow the heat dissipator to conduct heat away from the components more effectively than other heat spreader materials while occupying a fraction of the space of the other heat spreader materials.

Figure 2:
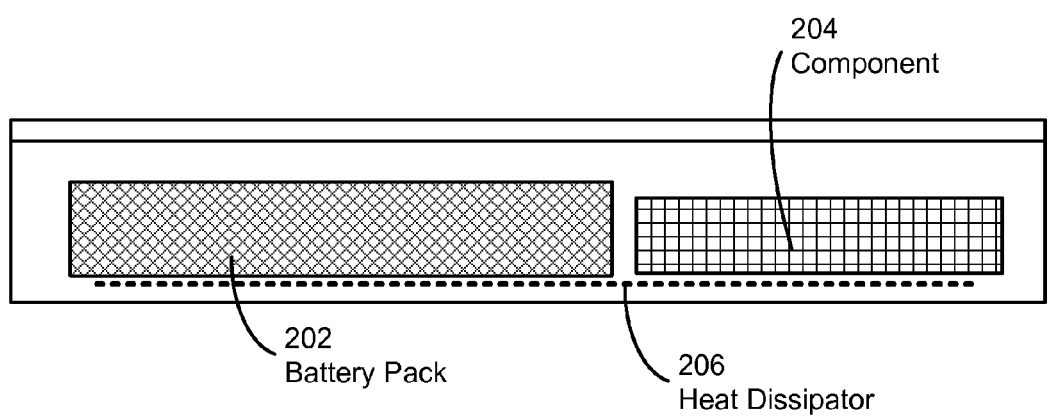
FIG. 2 shows a cross-sectional view of a portable electronic device in accordance with the disclosed embodiments.

FIG. 2 shows a cross-sectional view of a portable electronic device (e.g., portable electronic device 102 of FIG. 1) in accordance with the disclosed embodiments. As shown in FIG. 2, the portable electronic device includes a battery pack 202 and a component 204. Battery pack 202 and component 204 are disposed side-by-side within an enclosure of the portable electronic device.

A heat dissipator 206 is also disposed over the surface of battery pack 202 and placed in thermal contact with component 204. For example, heat dissipator 206 may extend past the surface of battery pack 202 to cover a surface of component 204. Heat dissipator 206 may thus transfer heat from component 204 to other areas of the portable electronic device. For example, heat dissipator 206 may transfer heat from component 204 to battery pack 202 and/or the enclosure of the portable electronic device to facilitate the safe and/or reliable operation of component 204. The heat transfer may additionally increase the temperature of battery pack 202, which in turn may improve the runtime of a solid-state battery in battery pack 202.

As mentioned above, heat dissipator 206 may be composed of graphene. Heat dissipator 206 may be disposed over a surface of battery pack 202 and/or component 204 by pressing a monolayer of graphene onto the surface of battery pack 202 and/or component 204. For example, the graphene monolayer may be grown on a substrate and/or exfoliated from graphite. The graphene monolayer may then be disposed over a layer of polypropylene on a flexible pouch in battery pack 202. The graphene monolayer may also be disposed over a surface of a PCB, processor, power supply unit (PSU), backlight, charging circuit, HDD, and/or radio transceiver corresponding to component 204.

The use of graphene in heat dissipator 206 may reduce the amount of space occupied by heat dissipator 206 while providing effective dissipation of heat from component 204. First, the thermal conductivity of graphene near room temperature may range from $(4.84 \pm 0.44) \times 10^3$ to $(5.30 \pm 0.48) \times 10^3$ $Wm^{-1}K^{-1}$, which is in excess of the thermal conductivities of carbon nanotube and/or diamond. Consequently, heat dissipator 206 may transfer heat away from component 204 more effectively than materials such as graphite and copper, resulting in increased reliability, user comfort, and safety during use of the portable electronic device.

Second, the high tensile strength of graphene may allow a graphene monolayer less than one nanometer thick to be used as heat dissipator 206. Heat dissipator 206 may thus provide significant space savings over other heat spreader materials, which may range in thickness from tens of microns to a millimeter. The reduction in space occupied by heat dissipator 206 may additionally facilitate a decrease in the portable electronic device's size and/or an increase in the portable electronic device's portability and/or physical attractiveness. Conversely, the space savings may be used to increase the size and capacity of battery pack 202 and/or add other components to the portable electronic device.

Figure 3:
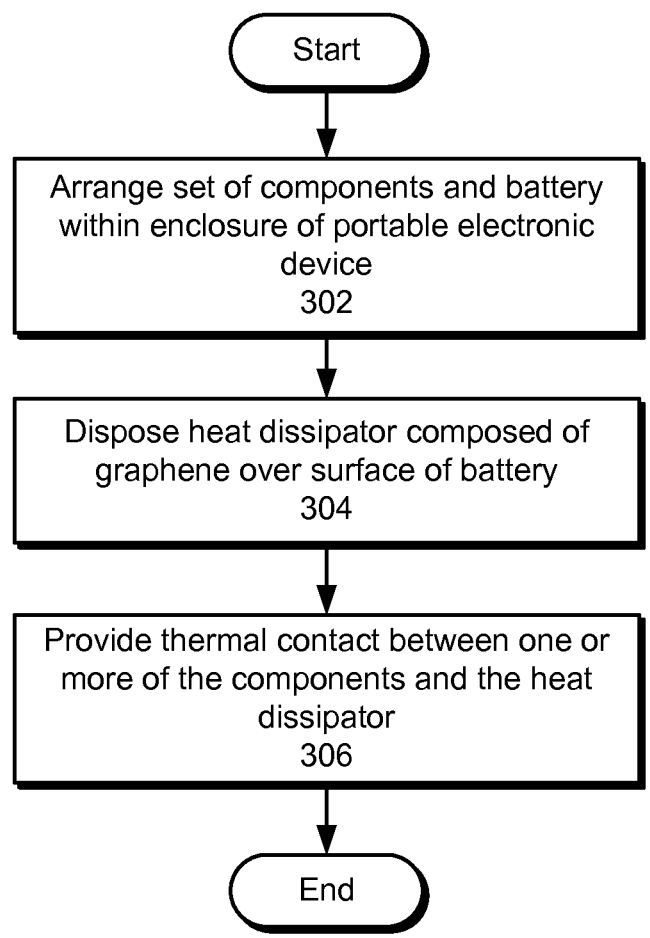
FIG. 3 shows a flowchart illustrating the process of facilitating the use of a portable electronic device in accordance with the disclosed embodiments.

FIG. 3 shows a flowchart illustrating the process of facilitating the use of a portable electronic device in accordance with the disclosed embodiments. In one or more embodiments, one or more of the steps may be omitted, repeated, and/or performed in a different order. Accordingly, the specific arrangement of steps shown in FIG. 3 should not be construed as limiting the scope of the embodiments.

Initially, a set of components and a battery are arranged within an enclosure of the portable electronic device (operation 302). The components may include a processor, a PSU, a backlight, a charging circuit, a PCB, an HDD, and/or a radio transceiver.

The battery may correspond to a lithium-ion and/or lithium-polymer battery that includes a set of layers (e.g., a cathode with an active coating, a separator, and an anode with an active coating). The layers may be wound to create a jelly roll and enclosed in a flexible pouch. The flexible pouch may include a layer of aluminum and a layer of propylene.

Alternatively, the battery may correspond to a solid-state battery with a cathode current collector, a cathode active material, a solid electrolyte composed of LiPON, an anode active material, and an anode current collector layered over a non-conducting substrate. The runtime of the solid-state battery may increase as a function of temperature.

Next, a heat dissipator composed of graphene is disposed over a surface of the battery (operation 304). The graphene may be grown on a substrate and/or exfoliated from graphite. The graphene may then be pressed onto the surface of the battery. For example, the graphene may be placed over the layer of polypropylene on the flexible pouch for the lithium-ion and/or lithium-polymer battery.

Finally, thermal contact between one or more of the components and the heat dissipator is provided (operation 306). The thermal contact may be provided by further disposing the heat dissipator over the surface of the component(s). For example, the heat dissipator may be extended past the battery onto the surface of a PCB that is placed side-by-side with the battery. The heat dissipator may then transfer heat from the components to the battery and/or other parts of the portable electronic device. In addition, the transferred heat may increase the temperature of the solid-state battery, resulting in increased runtime of the solid-state battery.

Figure 4:
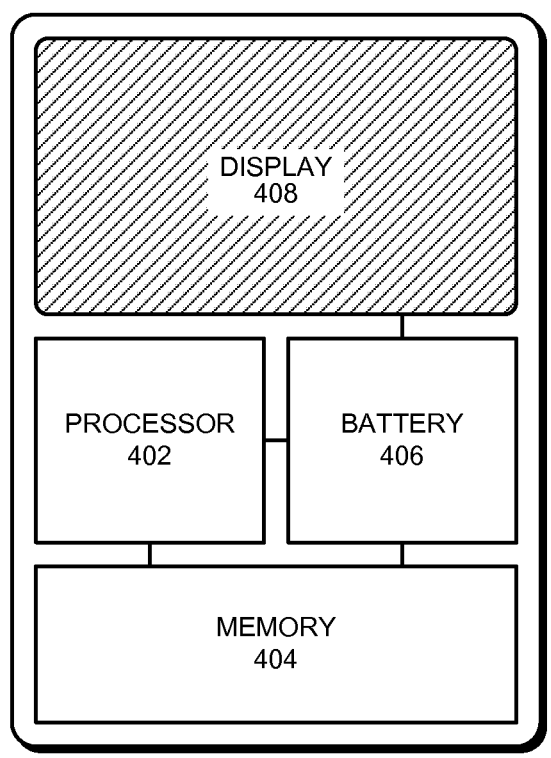
FIG. 4 shows a portable electronic device in accordance with the disclosed embodiments.

The above-described heat dissipator can generally be used in any type of electronic device. For example, FIG. 4 illustrates a portable electronic device 400 which includes a processor 402, a memory 404 and a display 408, which are all powered by a battery 406. Portable electronic device 400 may correspond to a laptop computer, mobile phone, PDA, tablet computer, portable media player, digital camera, and/or other type of battery-powered electronic device. Battery 406 may correspond to a battery pack that includes one or more battery cells. A heat dissipator composed of graphene may be disposed over a surface of the battery pack and placed in thermal contact with one or more of the components (e.g., processor 402, memory 404, etc.) of portable electronic device 400. The heat dissipator may transfer heat from the components to the battery 406 and/or other areas of portable electronic device 400.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A portable electronic device, comprising:
    a set of components powered by a battery pack;
    the battery pack comprising a battery cell; and
    a monolayer of graphene forming a heat dissipator, the monolayer of graphene coupled to the battery pack and one or more of the components, wherein the battery pack and the one or more of the components are positioned side by side on the monolayer of graphene, wherein the heat dissipator is configured to transfer heat from the one or more components to the battery pack to increase the temperature of battery pack.

2. The portable electronic device of claim 1, wherein the set of components comprises at least one of a processor, a power supply unit (PSU), a backlight, a charging circuit, a printed circuit board (PCB), a hard disk drive (HDD), and a radio transceiver.

3. The portable electronic device of claim 1, wherein the battery cell comprises:
    a set of layers comprising a cathode with an active coating, a separator, and an anode with an active coating; and
    a pouch enclosing the layers, wherein the pouch is flexible.

4. The portable electronic device of claim 3, wherein the pouch comprises:
    a layer of aluminum; and
    a layer of polypropylene.

5. The portable electronic device of claim 4, wherein the heat dissipator is disposed over the layer of polypropylene.

6. The portable electronic device of claim 3, wherein the layers are wound to create a jelly roll.

7. The portable electronic device of claim 1, wherein the battery cell comprises:
    a cathode current collector;
    a cathode active material;
    a solid electrolyte;
    an anode active material; and
    an anode current collector.

8. The portable electronic device of claim 7, wherein the solid electrolyte comprises lithium phosphorous oxynitride (LiPON).

9. The portable electronic device of claim 1, wherein the thermal contact between the heat dissipator and the one or more of the components is provided by:
    further disposing the heat dissipator over a surface of one or more of the components.

10. A method for facilitating the use of a portable electronic device, comprising:
    arranging a set of components and a battery within an enclosure of the portable electronic device;
    coupling the battery to a monolayer of graphene; and
    coupling one or more of the components to the monolayer of graphene, wherein the battery is positioned side by side with the one or more of the components on the monolayer of graphene;

wherein the monolayer of graphene forms a heat dissipator, and wherein the heat dissipator is configured to transfer heat from the one or more components to the battery to increase a temperature of battery.

11. The method of claim 10, wherein the set of components comprises at least one of a processor, a power supply unit (PSU), a backlight, a charging circuit, a printed circuit board (PCB), a hard disk drive (HDD), and a radio transceiver.

12. The method of claim 10, wherein the battery comprises:
a set of layers comprising a cathode with an active coating, a separator, and an anode with an active coating; and
a pouch enclosing the layers, wherein the pouch is flexible.

13. The method of claim 12, wherein the pouch comprises:
a layer of aluminum; and
a layer of propylene.

14. The method of claim 13, wherein the heat dissipator is disposed over the layer of polypropylene.

15. The method of claim 12, wherein the layers are wound to create a jelly roll.

16. The method of claim 10, wherein the battery comprises:
a cathode current collector;
a cathode active material;
a solid electrolyte;
an anode active material; and
an anode current collector.

17. The method of claim 16, wherein the solid electrolyte comprises lithium phosphorous oxynitride (LiPON).

18. The method of claim 10, wherein providing thermal contact between the one or more of the components and the heat dissipator involves:
further disposing the heat dissipator over a surface of the one or more of the components.

* * * * *